(12) United States Patent
Watanabe

(10) Patent No.: US 6,263,474 B1
(45) Date of Patent: Jul. 17, 2001

(54) DATA DECODING APPARATUS AND DATA DECODING METHOD

(75) Inventor: Masatoshi Watanabe, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/158,799

(22) Filed: Sep. 23, 1998

(30) Foreign Application Priority Data

Oct. 1, 1997 (JP) .................................................. 9-284568

(51) Int. Cl.[7] .................................................. H03M 13/03
(52) U.S. Cl. ........................ 714/796; 714/796; 714/794; 375/262; 375/265
(58) Field of Search ..................... 714/794–796, 714/791–792; 375/262, 265, 240.26, 240.05, 240.15, 240.16

(56) References Cited

U.S. PATENT DOCUMENTS

| | | | |
|---|---|---|---|
| 5,349,608 | * | 9/1994 | Graham et al. ........................ 375/341 |
| 5,432,803 | * | 7/1995 | Liu et al. ............................... 714/794 |
| 5,440,504 | | 8/1995 | Ishikawa et al. ..................... 708/490 |
| 5,502,493 | * | 3/1996 | Meyer .................................... 348/845 |
| 5,742,621 | * | 4/1998 | Amon et al. ........................... 714/792 |
| 5,812,601 | * | 9/1998 | Schramm ............................... 375/262 |
| 5,862,156 | * | 1/1999 | Huszar et al. ........................ 371/43.7 |

FOREIGN PATENT DOCUMENTS

| | | | |
|---|---|---|---|
| 5183450 | 7/1993 | (JP) | .............................. H03M/13/12 |
| 5308296 | 11/1993 | (JP) | .............................. H03M/13/12 |
| 6204896 | 7/1994 | (JP) | .............................. H03M/13/12 |
| 7-74694 | 3/1995 | (JP) | .............................. H04B/7/26 |

OTHER PUBLICATIONS

Luthi et al.(High Rate Soft Output Viterbi Decoder.IEEE, 1996).*
Hole et al.(Tight Bounds on the Minimum Average Weight per Branch for Rate(N–1)/N Convolutional Codes. IEEE, Jul. 1997).*
Berrou et al.(A Low Complexity Soft–Output Viterbi Decoder Architecture.IEEE, 1993).*
An English Language abstract of JP 5–183450.
An English Language abstract of JP 5–308296.
An English Language abstract of JP 7–74694.
Forney, G.D., "The Viterbi Algorithm," Proceedings of the IEEE, vol. 61, No. 3, pp. 268–78 Mar. 1973).
An English Language abstract of JP 6–204896.

* cited by examiner

Primary Examiner—Albert Decady
Assistant Examiner—Guy Lamarre
(74) Attorney, Agent, or Firm—Greenblum & Bernstein P.L.C.

(57) ABSTRACT

Received signal 201 is input to one frame memory 202 and initial weight calculating section 203. One frame memory section 202 delays one frame of received signal 201 to input to floating point ACS processing section 204. On the other hand, initial weight calculating section 203 integrates an amplitude of the received signal, i.e., the absolute value of received signal level 201 over one frame, and inputs the resultant to floating point ACS section 204. Floating point ACS processing section 204 performs the ACS processing using the output from initial weight calculating section 203 as an initial weight, and inputs the path select result to trace back processing section 205. Trace back processing section 205 reproduces the state transition of the coder based on the input from Floating point ACS processing section 204 to output decoded information sequence.

8 Claims, 11 Drawing Sheets

DATA DECODING APPARATUS AND DATA DECODING METHOD

BACKGROUND OF THE INVENTION

1. Field of the Invention

The present invention relates to a data decoding apparatus and a data decoding method used in a data transmission in a digital mobile telephone and a satellite communication.

2. Description of the Related Art

One of decoding methods for convolutional codes is the Viterbi decoding that uses the Viterbi algorithm. The Viterbi decoding is explained with reference to FIG. 1. FIG. 1 illustrates the case of transmitting information of J bits using a convolutional coder with constraint length K=3 and code rate R=½.

In FIG. 1, an input information sequence is stored in F0 and F1 of the shift register. Further when 1 bit is inputted, two bits of Ci(1) and Ci(2) are obtained as an output using the current input value (bi) and the two previous input values of (bi−1) and (bi−2) stored in the shift register.

An operation of the coder in the case of transmitting information of j bits using the coder is explained. First the states of F0 and F1 of the shift register are set at all 0, and J bits of the information sequence bn (n=0 up to N=j−1) are sequentially inputted. After all bits of the information sequence are inputted, further K−1=3−1=2 bits of 0 are input to set the all contents of the shift register at 0. The bit sequence to set the all contents of the shift register at 0 is called tail bit. According to the operation described above, a code sequence of 2×(J+K−1) bit length is obtained, and the obtained code sequence is transmitted via a radio transmission path.

At this time, the coder state S is set at either of following four states, i.e., S0=(0,0), S1=(1,0), S2=(0,1) and S3=(0,3) depending on the states of F0 and F1 in the shift register. The trellis structure is a representation showing the transition of states in the coder starting from the initial state S0 according to each input of an information sequence signal. FIG. 2 illustrates the trellis representation of the code sequence described above. In the Trellis representation, a part like a tree branch is called branch, and the linked more than two branches are called path.

In the Trellis representation illustrated in FIG. 2, a dotted branch indicates that an input signal is "0", and a solid line indicates that an input signal is "1". Further an input of the coder is indicated along a branch, and in the parenthesis, the left number indicates Ci(1) and the right number indicates Ci(2).

It is understandable with reference to FIG. 2 that the coder has any states of S0 up to S3 according to the contents of input information sequence at time tJ, and terminates the state of S0 by the input of tail bit at time tJ+2.

FIG. 3 illustrates a block diagram illustrating a configuration of a Viterbi decoder. The decoding method is explained with FIG. 3. In the Viterbi decoder, the information sequence is decoded by reproducing the state transition of the coder using a received code sequence according to the following procedure.

First, received signal 1 received via radio transmission paths is in decider 2 converted into a received sequence with binary values of 0 and 1. The received sequence is input to ACS (Add Compare Select) processing section 3. ACS processing section 3 performs the ACS processing using received sequence C'n(1) and C'n(2) corresponding to time tn in the trellis representation in FIG. 2. In the ACS processing, the likelihood that indicates the matching degree of an output of the coder at each branch during time tn−1 up to time tn in the Trellis representation and the received sequence is obtained as a branch metric.

Two branches present at each state of time tn (the transitions from the different two states at time tn−1), and a branch of higher likelihood is selected according to the following way.

The sum of accumulated path metric at time tn−1 and a branch metric is obtained for each of the two branches, and the branch of higher likelihood is selected. Further the summed result of the selected metric is determined as the accumulated path metric of the state at time tn.

For instance, as illustrated in FIG. 4, obtain a selected path and an accumulated path metric of the state S0 at time tn when it is assumed that (1,1) is obtained for C'n(1) and C'n(2) as a received sequence. The stated S0 at time tn has two branches from the state S0 and the state S2 at time tn−1. When a hamming distance between the received sequence and the coder output is defined as a metric, the branch metric from S0 to S0 is 2, and the branch metric from S2 to S0 is 0. At time tn−1, the accumulated path metric at S0 is 2 and the accumulated path metric at S2 is 0, therefore the sum results of each branch are 4 and 0 respectively. Herein because the hamming distance is used as a likelihood, the smaller sum result is, the higher likelihood is. Accordingly, as the result of the state S0 at time tn, the accumulated path metric is 0 by selecting the path from the state S2 at time tn−1.

The above processing is performed for all times and all states in the Trellis representation, and each selected path is stored. In this case, it is already known at a received side that the state starts from S0 at time t0. Then the path metric from S0 at time t0 is set at a value of high enough likelihood compared with other path metrics from S1 up to S3 at time t0, which is called initial weight.

Next the trace back processing is performed in trace back processing section 4 using the above result of the ACS processing. It is already known at the received side that the state of the coder at time tJ+2 is S0 that is caused by the input of the tail bit at a transmit side. Therefore the state at time tJ+1 is obtained using the selected path at S0 at time tJ+2 obtained from the ACS result.

By repeating the above processing, the state transition of the coder is obtained while going back to the previous state. Decoded information sequence 5 is obtained as described above when the coder state transition indicates the information sequence at the transmit side.

In the above explanation, as a metric, the hamming distance between a received sequence of 1 and 0 obtained by the hard decision and a coder output is used, however it is preferable to use more levels obtained by the soft decision than two levels of 0 and 1 as a received sequence in the Viterbi decoding. That makes it possible to improve the error correction capability in the Viterbi decoding.

In a mobile communication such as cellular telephone, the received level varies depending on the distance between a mobile station and a base station, and a cellular telephone of a-several-kilometer-radius has a variation range of 60 dB up to 80 dB. Further the received level varies several dB instantly by fading caused by multi-path propagation. In the case of applying the above Viterbi decoding to such transmission condition described above, a level variation is controlled by AGC (Auto Gain Control) and the like, and the soft decision Viterbi decoding is performed while controlling the variation range under 10~20 bits in the fixed point representation. It is easy to set the initial weight in this method because the level variation is made small enough.

In contrast to the method to perform the fixed point processing described above, there is another method to perform the soft decision Viterbi decoding in which a variation of a received signal is represented with a floating point using a floating point digital signal processing processor and the like. By using this method, it is possible to make the error correction decoding capability higher.

However in the soft decision Viterbi decoding in which the floating point processing is performed, as described above, the variation range of a received sequence remains the problem that it is difficult for ACS processing section to set the initial weight. In other words, since the ACS processing is to accumulate the level of received sequence and the initial weight, in the case where the initial weight is set for the maximum received level, the scale of branch metric of each received sequence in calculating the path metric at the time of decoding a signal of low received level is under the error range, which makes it impossible to decode the signal. For instance, in the case where a received level varies around −100 dBm($10^{-13}$W), when the initial weight is assumed to be around −20 dBm($10^{-5}$W) and the initial weight and the received signal are accumulated as a metric, the variation of the received signal is too small against the initial weight and impossible to monitor. In this case, it is not possible to decode the information because the information signal is not available.

On the other hand, in the case where the initial weight is set for the small received level, the initial weight is ignored at the time of decoding a signal of a high received level, which results in decrease of error correction capability. That is, the decoding capability deteriorates even when the initial weight is 0.

SUMMARY OF THE INVENTION

An object of the present invention is to provide a data decoding apparatus and a data decoding method in which an appropriate initial weight is always set in the soft decision Viterbi decoding with floating point, and the Viterbi decoding having high error correction capability is performed.

The object is achieved by a data decoding apparatus comprising an initial weight calculating section in which the total of an amplitude of a received signal in the decode unit length is obtained as an initial weight of the ACS calculating section.

DETAILED DESCRIPTION OF THE PREFERRED EMBODIMENTS

The data decoding apparatus in the present invention comprises an initial weight deciding section for deciding an initial weight corresponding to a decoding unit length of a received signal, and a floating point ACS processing section for performing the floating point ACS processing using the initial weight.

In the data decoding method of the present invention, an initial weight corresponding to a decoding unit length of a received signal is decided, and the soft decision Viterbi decoding is performed by the floating point ACS processing using the initial weight.

In the constitution described above, since the initial weight is always controlled within the optimal level at the time of calculating the floating point ACS processing, it is possible to improve the error correction capability.

In the above data decoding apparatus, it is preferable that the initial weight deciding section decide the initial weight by integrating the amplitude in a decoding unit length of a received signal. And in the above data decoding method, it is preferable to decide the initial weight by integrating an amplitude in a decoding unit length of a received signal. In the constitutions, it is possible to decide the initial weight precisely and efficiently, which allows the optimal control of the initial weight.

In the above data decoding apparatus, it is preferable that the floating point ACS processing section perform the floating point ACS processing using an initial weight corresponding to the previous decoding unit length. And in the above data decoding method, it is preferable that the initial weight for the decoding unit length be stored in a memory, and the initial weight be used for the floating point ACS processing for the decoding unit length later than the above the decoding unit length. In the constitutions, it is possible to remove a memory for the received signal, and reduce the decoding delay.

In the above data decoding apparatus, it is preferable that the floating point ACS processing section use the accumulated path metric of final selected path for the previous decoding unit length as the initial weight. And in the above data decoding method, it is preferable that the accumulated path metric, of final selected path for the decoding unit length be obtained to store in a memory, and the accumulated path metric be used in the floating point ACS processing for a decoding unit length later than the decoding unit length. In the constitutions, it is possible to remove an initial weight calculating section and to reduce the processing.

The above data decoding apparatus is applicable to a communication terminal apparatus such as a mobile station apparatus and a base station apparatus in a radio communication system. That makes it possible to perform a data communication under the high error correction capability.

Hereinafter, the embodiments of the present invention are explained with reference to the attached drawings in detail.

First Embodiment

Figure 1:
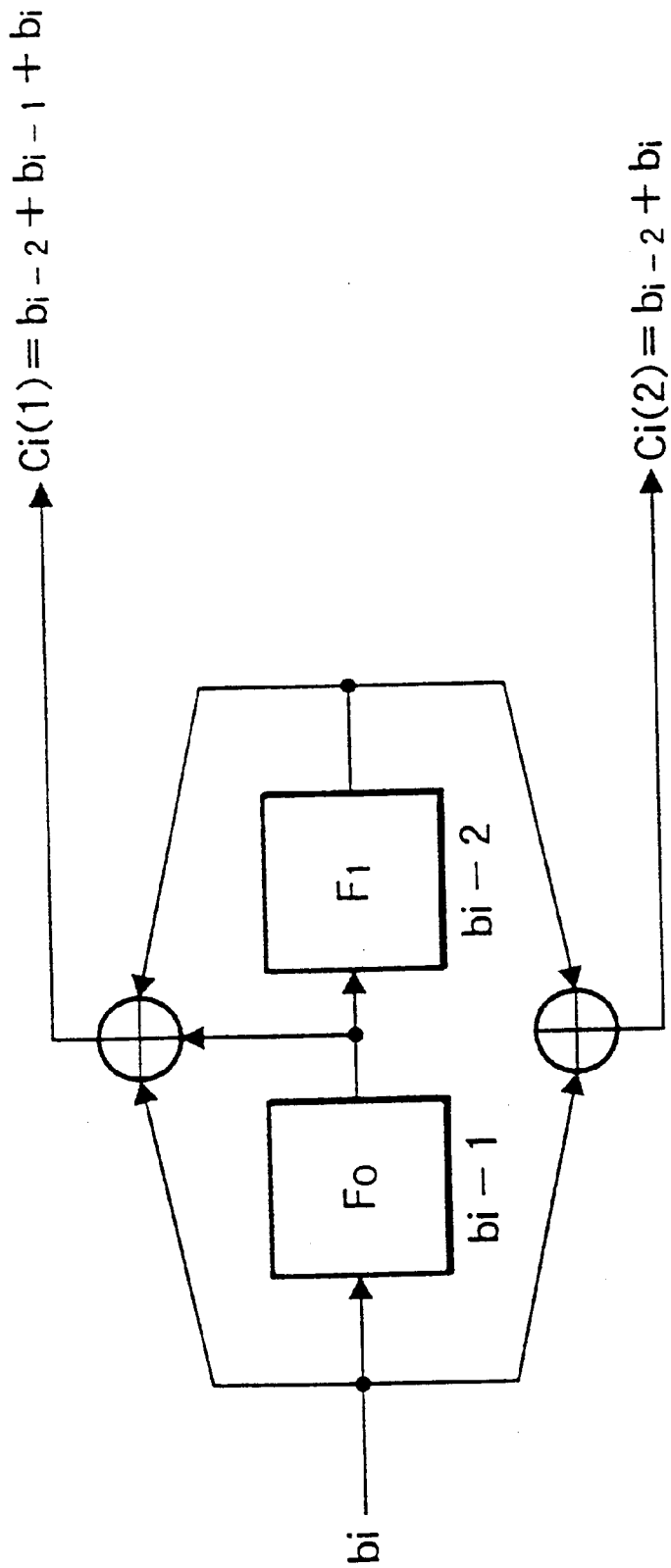
FIG. 1 is a configuration diagram illustrating a convolutional decoder.
Figure 2:
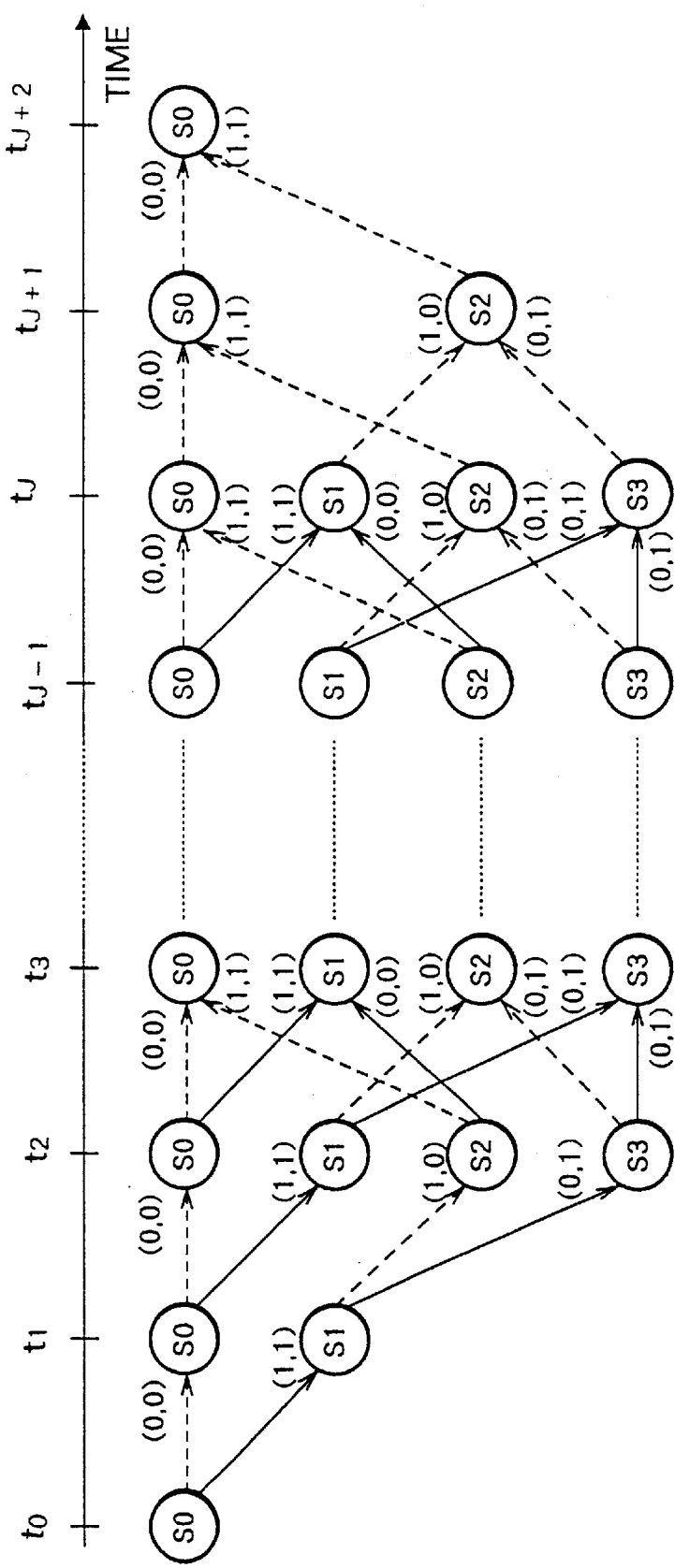
FIG. 2 is the Trellis representation used in the Viterbi decoding.
Figure 3:
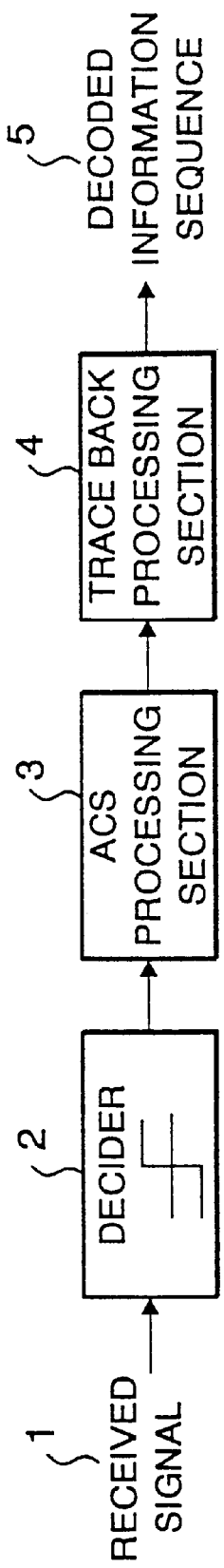
FIG. 3 is a block diagram illustrating a conventional Viterbi decoder.
Figure 4:
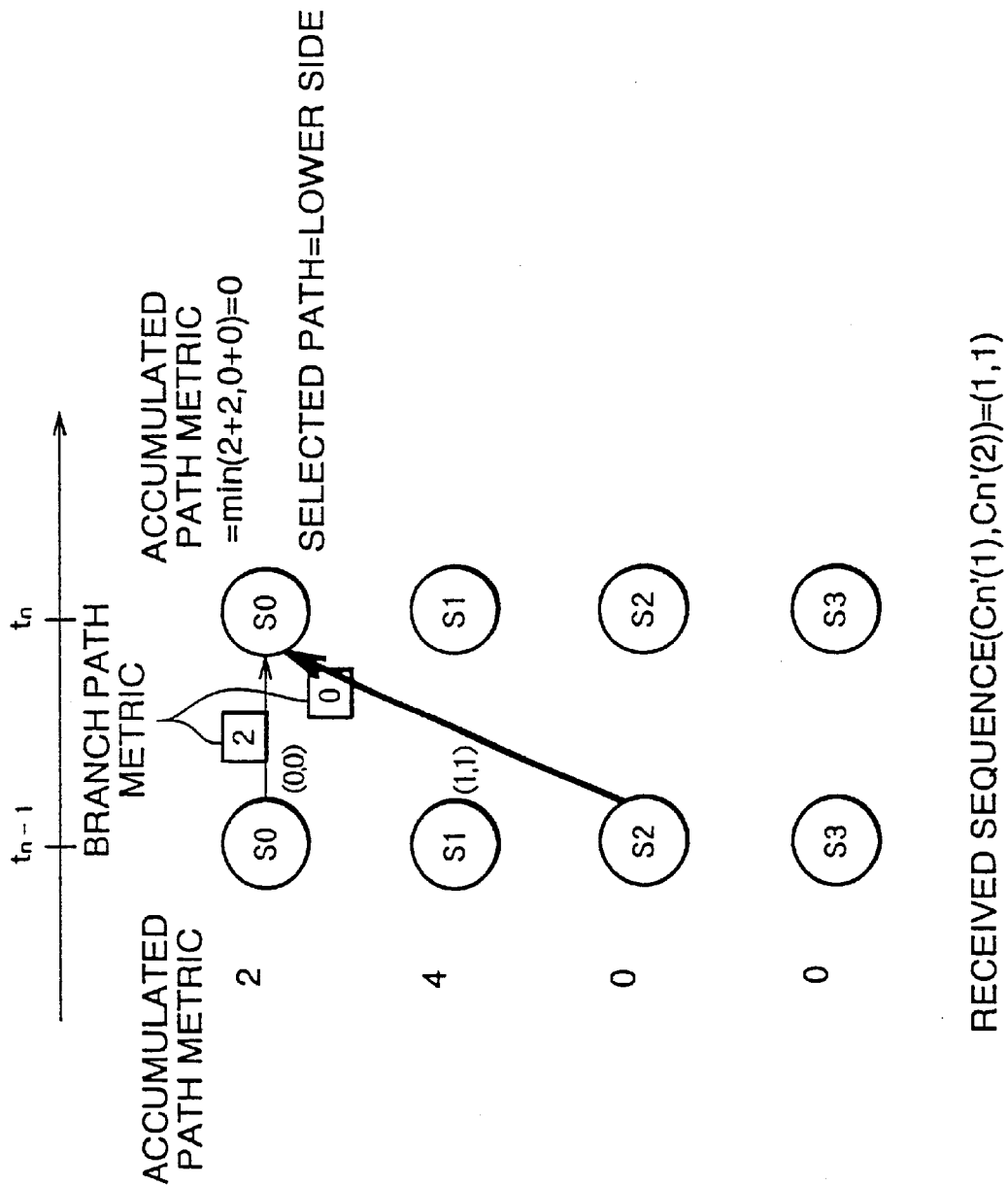
FIG. 4 is a concept diagram of the ACS processing performed in the Viterbi decoding.
Figure 5:
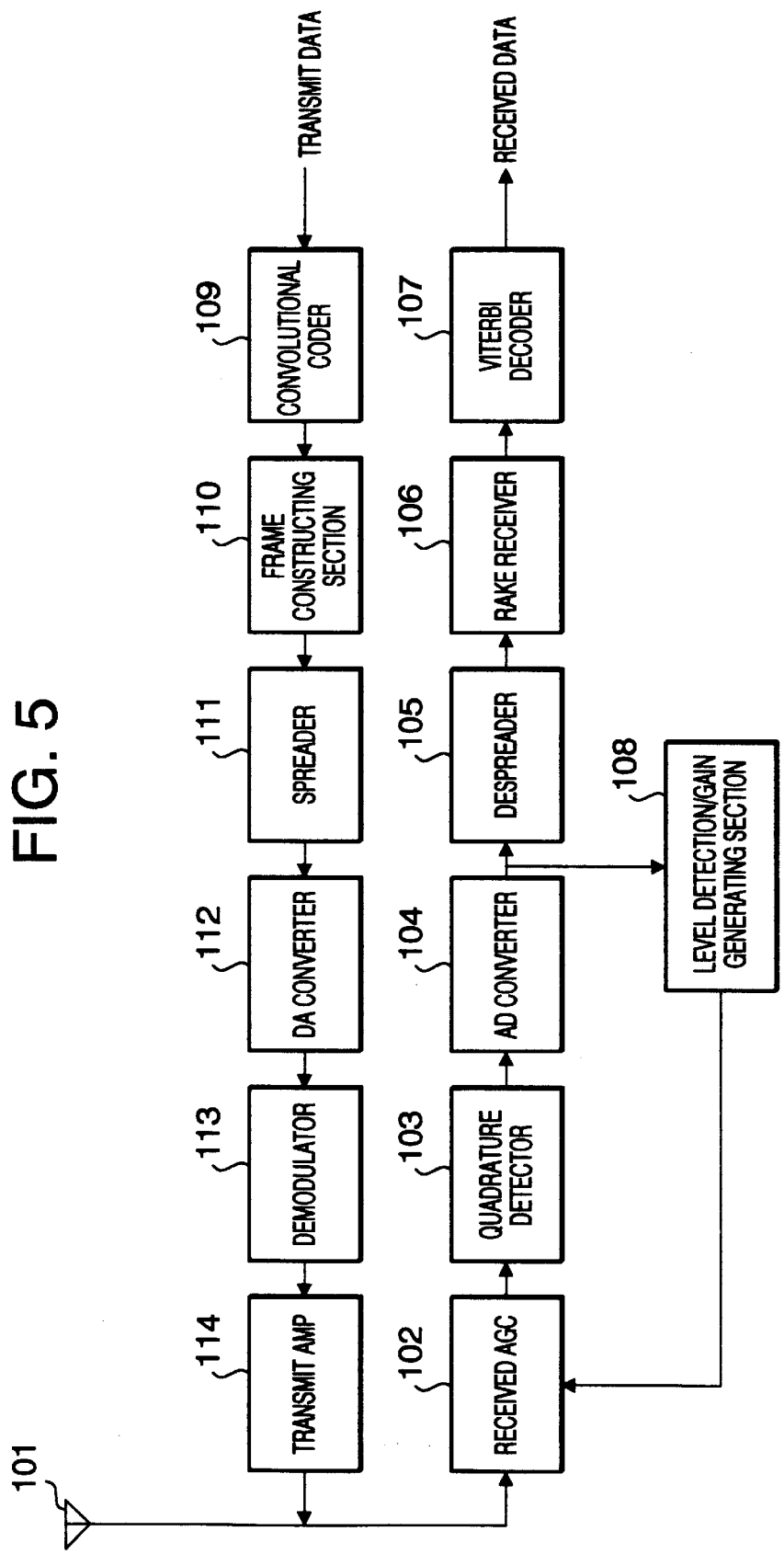
FIG. 5 is a block diagram illustrating a schematic configuration of a radio communication apparatus including a data decoding apparatus of the present invention.

FIG. 5 is a block diagram illustrating a schematic configuration of a radio communication apparatus comprising a data decoding apparatus of the present invention. A received signal is received via antenna 101, and the level variation of the received signal is controlled in received AGC 102. The received signal is demodulated in quadrature detector 103, A/D converted in A/D converter 104, and transmitted to despreader 105. The signal despread and processed for the correlation in despreader 105 is processed for the RAKE combining in RAKE receiver 106, and decoded in Viterbi decoder 107 to obtain received data. In addition, the A/D converted digital signal is transmitted to level detection gain generating section 108, and the obtained gain information is transmitted to received AGC 102 to update the gain.

On the other hand, transmit data are convolutional coded in convolutional coder 109, and constructed into frames of a predetermined format in frame constructing section 110. Next the transmit signal is spread by a predetermined spreading code in spreader 111, and D/A converted in D/A converter 112. The D/A converted analogue signal is modulated in modulator 113, and amplified in transmit AMP 114, and transmitted via antenna 101.

Figure 6:
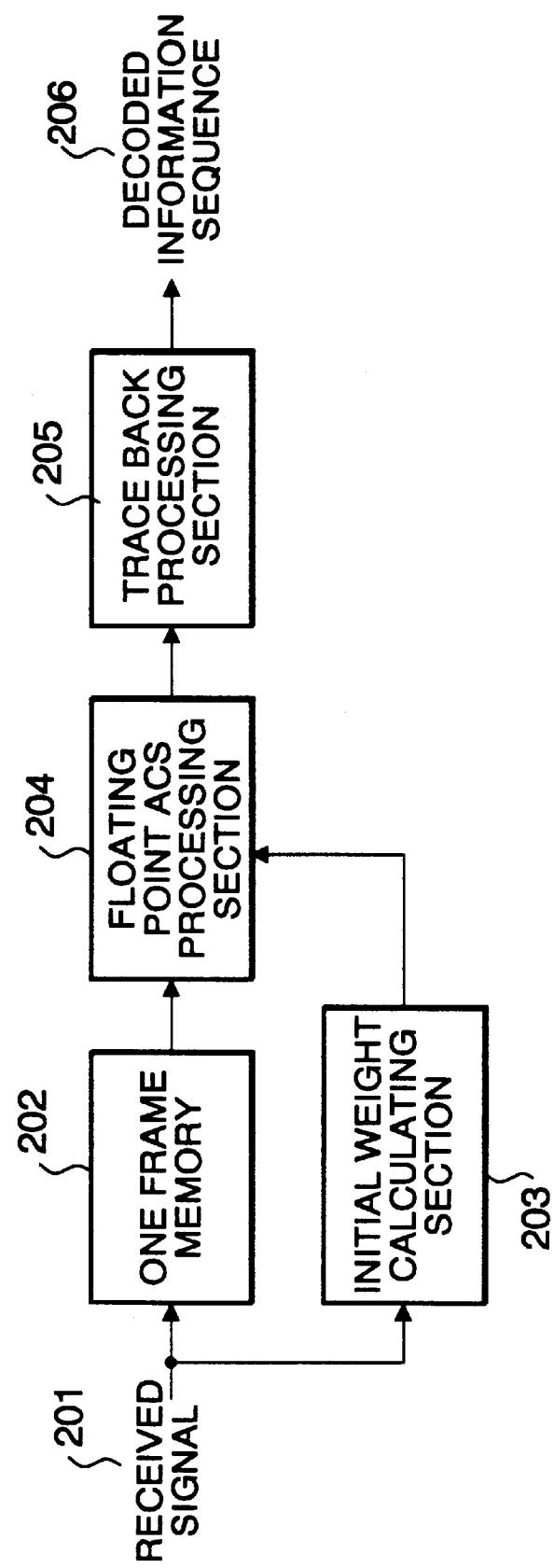
FIG. 6 is a block diagram illustrating a Viterbi decoder that is a data decoding apparatus in the first embodiment of the present invention.
Figure 7:
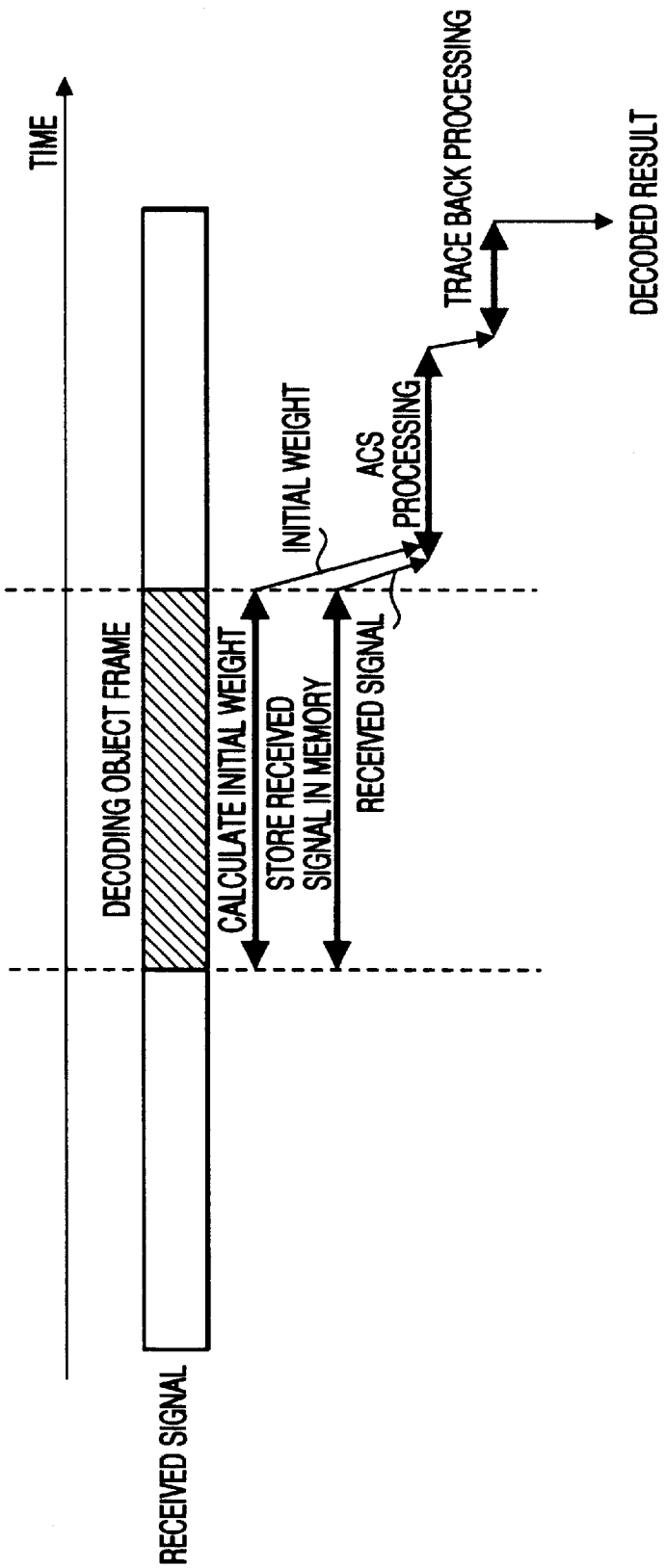
FIG. 7 is a diagram illustrating an operation timing in the Viterbi decoder of the above first embodiment.

FIG. 6 is a block diagram illustrating a configuration of Viterbi decoder in the first embodiment of the present invention. FIG. 7 is a timing diagram illustrating an operation according to the time in the Viterbi decoder of the first embodiment of the present invention.

The configuration and the operation of a coder in a transmit side in this embodiment is the same as those in a conventional apparatus. And at the time of coding data sequentially at the transmit side, the state of a shift register in a coder is cleared by inputting the tail bit in a certain interval. The interval is called frame. In a mobile communication or the like, a frame is usually tens ms (under 100 ms), and the level variation range of a received signal in a frame is caused only by the instant variation, and is about several dB.

Hereinafter, FIG. 6 and FIG. 7 are used to explain an operation of a Viterbi decoder. Received signal 201 is input to one frame memory 202 and initial weight calculating section 203. One frame memory section 202 delays one frame of received signal 201 to input to floating point ACS processing section 204. On the other hand, initial weight calculating section 203 integrates an amplitude of the received signal, i.e., the absolute value of the received signal level over one frame, and inputs the resultant to floating point ACS section 204 as an initial weight. Thus, the range of the received signal level is reflected to the initial weight.

Floating point ACS processing section 204 obtains a matching degree (likelihood) of a coder output in each branch and the received sequence as a branch metric using the Trellis representation. The processing result in floating point ACS processing section 204 is input to trace back processing section 205.

Next trace back processing section 205 performs the trace back processing. By repeating the processing described above, the state transition is obtained as going back to the previous state (previous frame), and decoded information sequence 206 is output.

In other words, in the Viterbi decoder, as illustrated in FIG. 7, the initial weight calculation is performed in an interval of a decoding object frame (shaded portion in the figure) to decide the initial weight corresponding to a decoding unit length of the received signal, while storing the received signal within the decoding object frame interval. And the ACS processing is performed, using the initial weight and the received signal, within the next frame interval that is later than the above frame interval. The trace back processing is performed using the ACS processing result, and the decoded information sequence is obtained as a decoded result.

Thus, in this embodiment, since the integration result of an amplitude of a received signal of a current decoding object frame is used as an initial weight, a received signal level range under propagation conditions in receiving is reflected to the initial weight. Therefore, an initial weight is set at a reasonable value with respect to the accumulated path metric of final path, not depending on the received average signal level in a current frame even in the case of the wide dynamic range like tens dB of the received signal level. And the initial weight can be set at the optimal value having the likelihood high enough, which improves the error correction capability.

Second Embodiment

Figure 8:
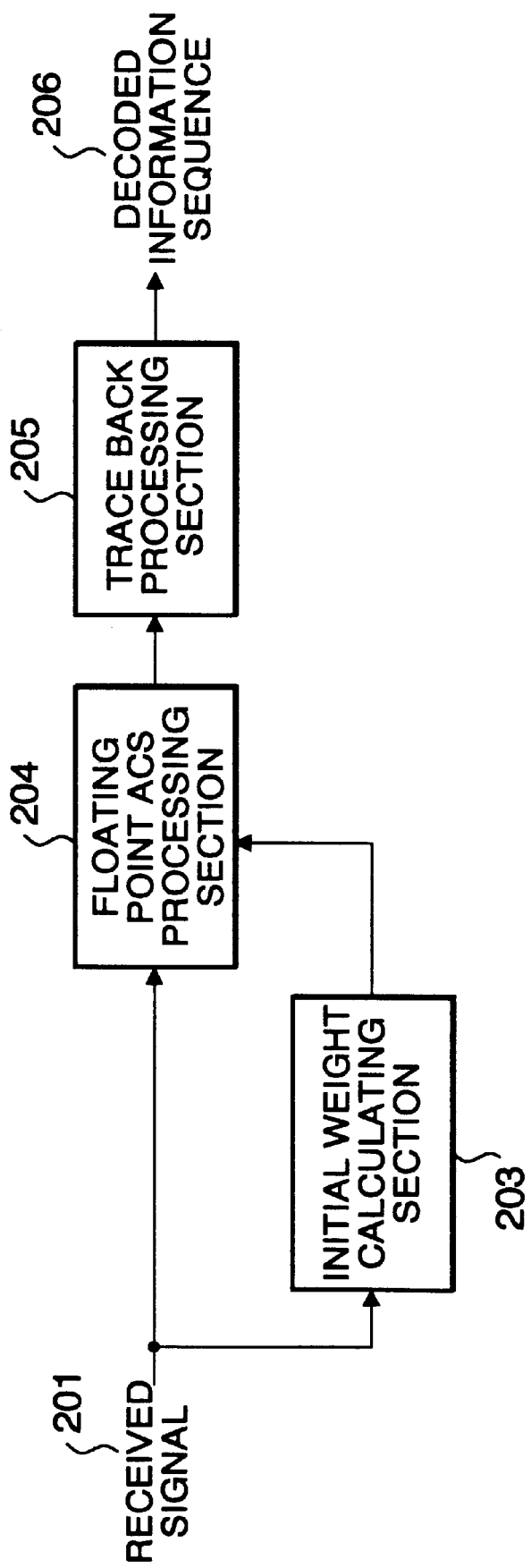
FIG. 8 is a block diagram illustrating a Viterbi decoder that is a data decoding apparatus in the second embodiment of the present invention.
Figure 9:
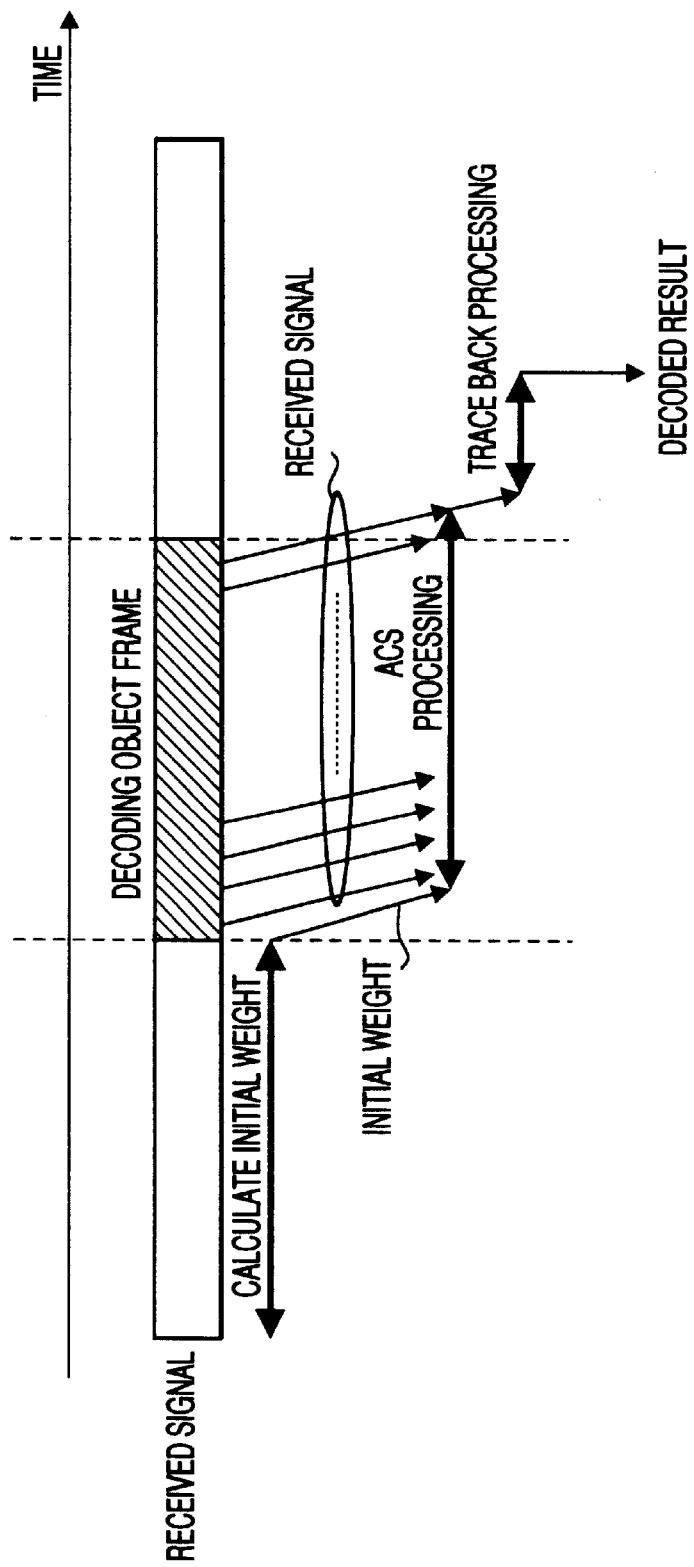
FIG. 9 is a diagram illustrating an operation timing in the Viterbi decoder of the above second embodiment.

FIG. 8 is a block diagram illustrating a configuration of a Viterbi decoder in the second embodiment of the present invention. FIG. 9 is a timing diagram illustrating an operation according to the time in the Viterbi decoder of the second embodiment of the present invention. In this embodiment, the configuration and operation are the same as those in the first embodiment, and those explanations are omitted.

Hereinafter, FIG. 8 and FIG. 9 are used to explain an operation in a Viterbi decoder. Received signal 201 is input to floating point ACS processing section 204 and initial weight calculating section 203. Initial weight calculating section 203 integrates an amplitude of the received signal, i.e., the absolute value of the received signal level over one frame, and inputs the resultant to floating point ACS processing section 204. Floating point ACS processing section 204 provides the ACS processing sequentially, as illustrated in FIG. 9, to the received signal in the next frame using an input from initial weight calculating section as an initial weight, and input the resultant to trace back processing section 205. Trace back processing section 205 performs the same processing as in the first embodiment, and outputs decoded information sequence 206.

In other words, in the Viterbi decoder, as illustrated in FIG. 9, the ACS processing is performed using an initial weight decided corresponding to a decoding unit length of a received signal in the latest frame interval before the decoding object frame interval (shaded portion in the figure), and the received signal in the decoding object frame interval, the trace back processing is performed using the ACS processing result, and a decoded information sequence is obtained as a decoded result.

Thus, in this embodiment, as an initial weight, an amplitude of a received signal, i.e., the integration of absolute values of a received signal level over one frame before the decoding object frame is used. Because of it, the range of the received level under the propagation condition in the reception is reflected to the initial weight.

In a mobile communication condition, since the averaged received level per a frame does not vary extremely during a few row frames, the averaged received level in the latest frame before the decoding object frame is assumed to be almost the same as that in the decoding object frame. Accordingly, an initial weight is set at a reasonable value with respect to the accumulated path metric of final path, and can be set at the optimal value having the likelihood high enough, not depending on the received signal level in a current frame even in the case of the wide dynamic range like tens dB of the received signal level.

Further the configuration is simplified when compared with that in the first embodiment because a memory for a received signal in a frame is not necessary. Even in this case, it is possible to improve the error correction capability in the same way as in the first embodiment.

Third Embodiment

Figure 10:
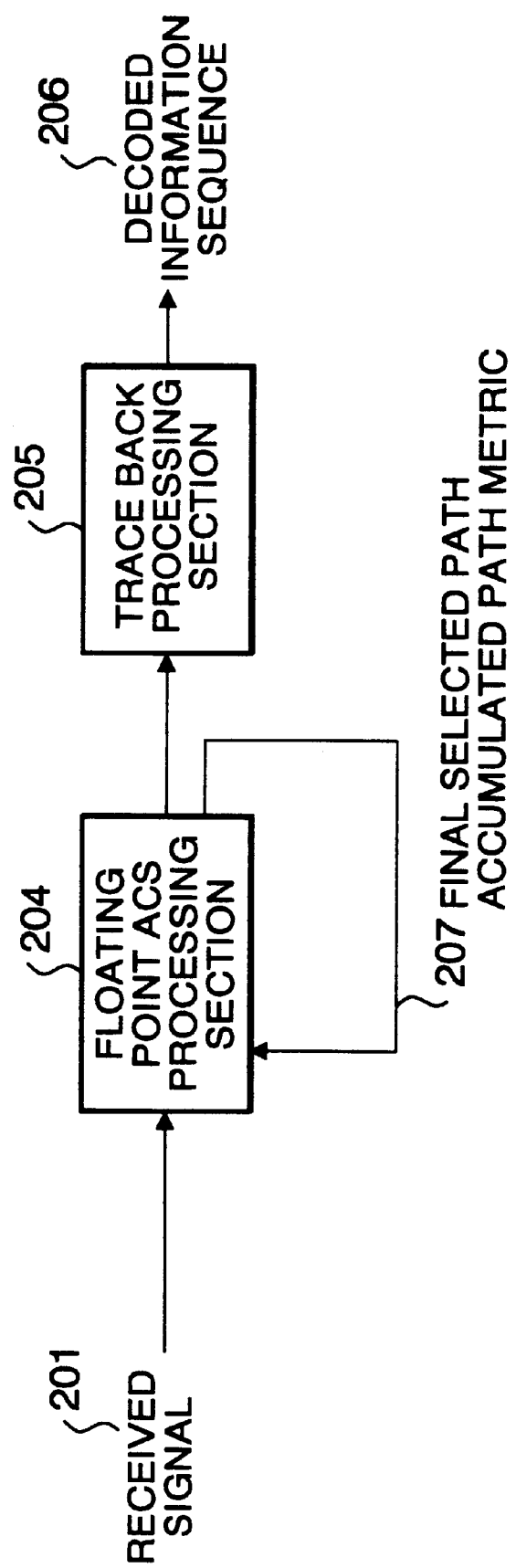
FIG. 10 is a diagram illustrating a data decoding apparatus in the third embodiment of the present invention.
Figure 11:
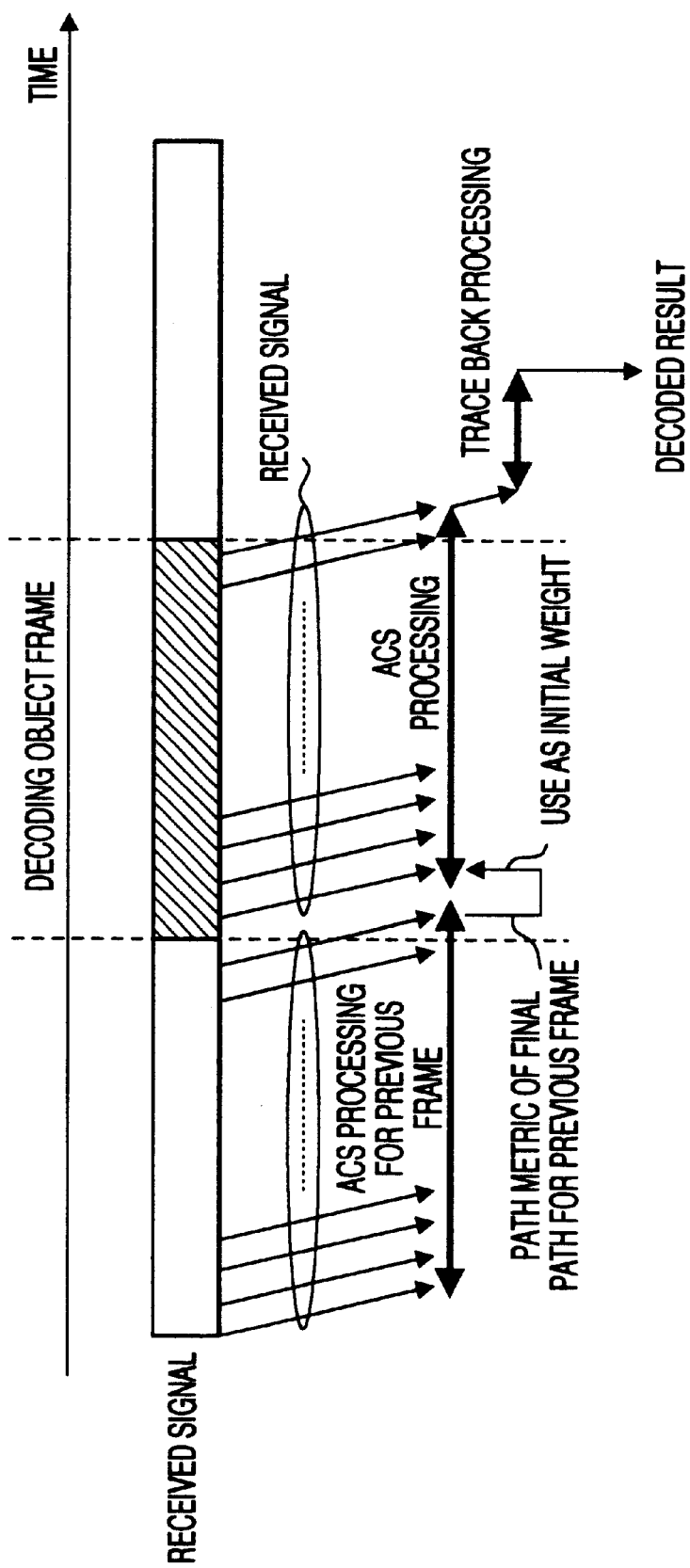
FIG. 11 is a diagram illustrating an operation timing in the Viterbi decoder of the above third embodiment.

FIG. 10 is a block diagram illustrating a configuration of a Viterbi decoder in the third embodiment of the present invention. And FIG. 11 is a timing diagram illustrating an operation according to the time in the Viterbi decoder in the third embodiment of the present invention. In this embodiment, the configuration and operation are the same as those in the first embodiment, and those explanations are omitted.

Hereinafter, an operation in a Viterbi decoder is explained with FIG. 10 and FIG. 11. Received signal 201 is input to floating point ACS processing sections 204. As illustrated in FIG. 11, float point ACS processing section 204 sequentially provides the ACS processing to a received signal of a decoding object frame using accumulated path metric of final path 207, which is a result of the ACS processing for one frame before the decoding object frame, as an initial weight, and inputs the resultant to trace back processing section 205. Trace back processing section 205 provides the same processing in the first embodiment to output decoded information sequence 206.

In other words, in the Viterbi decoder, as illustrated in FIG. 11, the ACS processing is performed using the final path metric of the latest frame before the decoding object frame (shaded portion in the figure) that is the initial weight determined corresponding to the decoding unit length of the received signal, and the received signal of the decoding object frame. The trace back processing is performed using the ACS processing result, and the decoded information sequence is obtained as a decoded result.

Thus, in this embodiment, the accumulated path metric that is a result of the ACS processing for one frame before the decoding object frame is used as an initial weight. The accumulated path metric is reflected by a range of a received signal level.

In a mobile communication condition, since the averaged received level per a frame does not vary extremely during a few row frames, the averaged received level in the latest frame before the decoding object frame is assumed to be almost the same as that in the decoding object frame. Accordingly, an initial weight is set at a reasonable value with respect to the accumulated path metric of final path, and can be set at the optimal value having the likelihood high enough, not depending on the received signal level in a current frame in spite of the wide dynamic range like tens dB of the received signal level.

Further the configuration is simplified when compared with that in the first embodiment because a memory for a received signal in a frame and initial weight calculating section are not necessary. Even in this case, it is possible to improve the error correction capability in the same way as in the first embodiment.

In the first embodiment up to the third embodiment described above, the explanations are given to the case of using convolutional code/Viterbi decoding, however it is possible to apply the present invention to the case of using turbo code/Viterbi decoding.

As described above, in the data decoding apparatus and the data decoding method of the present invention, since an initial weight is determined corresponding to an amplitude of a received signal, i.e., the absolute value of received signal level of a decoding unit length, the initial weight is set at the optimal value even in the case of the wide dynamic range like tens dB of the received signal level. Accordingly, in the present invention, it is possible to improve the error correction capability, not being influenced by the scale of a received level.

What is claimed is:

1. A data decoding apparatus comprising:
   an initial weight calculator for deciding an initial weight corresponding to a range of a received signal level;
   a floating point ACS processor for providing floating point ACS processing to a received signal using the initial weight; and
   a trace back processor for providing trace back processing to obtain decoded data, using a result of the floating point ACS processor;
   wherein the initial weight calculator decides the initial weight by integrating an amplitude of a decoding unit length of the received signal.

2. The data decoding apparatus according to claim 1, wherein said floating point ACS processor performs the floating point ACS processing using the initial weight corresponding to a previous decoding unit length.

3. The data decoding apparatus according to claim 2, wherein said floating point ACS processor uses an accumulated path metric of a final selected path for the previous decoding unit length.

4. A communication terminal apparatus having a data decoding apparatus, said data decoding apparatus comprising:
   an initial weight calculator for deciding an initial weight corresponding to a range of a received signal level;
   a floating point ACS processor for providing floating point ACS processing to a received signal using the initial weight; and
   a trace back processor for providing trace back processing to obtain decoded data, using a result of the floating point ACS processor;
   wherein the initial weight calculator decides the initial weight by integrating an amplitude of a decoding unit length of the received signal.

5. A base station apparatus having a data decoding apparatus, said data decoding apparatus comprising:
   an initial weight calculator for deciding an initial weight corresponding to a range of a received signal level;
   a floating point ACS processor for providing floating point ACS processing to a received signal using the initial weight; and
   a trace back processor for providing trace back processing to obtain decoded data, using a result of the floating point ACS processor;
   wherein the initial weight calculator decides the initial weight by integrating an amplitude of a decoding unit length of the received signal.

6. A data decoding method comprising:
   deciding an initial weight corresponding to a range of a received signal level;
   performing floating point ACS processing on a received signal using the initial weight; and
   performing trace back processing of the result of the floating point ACS processing to obtain decoded data;

wherein deciding the initial weight comprises integrating an amplitude of a decoding unit length of the received signal.

7. The data decoding method according to claim 6, further comprising:

storing the initial weight with respect to a decoding unit length in a memory; and using the stored initial weight in the floating point ACS processing for a subsequent decoding unit length.

8. The data decoding method according to claim 7, further comprising:

obtaining an accumulated path metric of a final selected path for the decoding unit length;

storing the accumulated path metric in the memory; and using the stored accumulated path metric in the floating point ACS processing for the subsequent decoding unit length.

* * * * *